(12) United States Patent
Huang et al.

(10) Patent No.: US 7,564,184 B2
(45) Date of Patent: Jul. 21, 2009

(54) DUAL DISPLAY DEVICE

(75) Inventors: Yan-Ming Huang, Taichung County (TW); Ching-Fu Hsu, Taichung County (TW); Wen-Tui Liao, Taichung (TW); Chien-Tzu Chu, Kaohsiung (TW); Ruey-Shing Weng, Kaohsiung (TW)

(73) Assignee: Wintek Corporation, Taichung (TW)

( * ) Notice: Subject to any disclaimer, the term of this patent is extended or adjusted under 35 U.S.C. 154(b) by 767 days.

(21) Appl. No.: 11/298,698

(22) Filed: Dec. 12, 2005

(65) Prior Publication Data

US 2007/0132379 A1    Jun. 14, 2007

(51) Int. Cl.
*H01J 63/04*    (2006.01)
(52) U.S. Cl. ...................................... 313/506; 313/498
(58) Field of Classification Search ......... 313/498–512; 445/23–25; 257/10; 345/60
See application file for complete search history.

(56) References Cited

U.S. PATENT DOCUMENTS 6,433,841 B1 *   8/2002   Murade et al. ................ 349/43
2005/0093767 A1 *   5/2005   Lu et al. ...................... 345/1.1

* cited by examiner

*Primary Examiner*—Joseph L Williams
(74) *Attorney, Agent, or Firm*—Muncy, Geissler, Olds & Lowe, PLLC

(57) ABSTRACT

A dual display device has pixels and each pixel includes a transparent substrate, an active driving circuit, a top organic LED, a bottom organic LED, an insulation layer that covers the active driving circuit and the bottom organic LED, and a contact hole. A connection element covers the insulation layer, the top organic LED is deposited on the connection element, and the anodes of the two LEDs electrically connect to the active driving circuit through the contact hole by the connection element. Hence, each pixel forms a structure that two organic LEDs stack together on the transparent substrate and the top and bottom organic LEDs can be driven respectively so as to achieve the dual display device.

14 Claims, 8 Drawing Sheets

DUAL DISPLAY DEVICE

FIELD OF THE INVENTION

The present invention relates to a display device, especially to an organic LED (Light-Emitting Diode) dual display device.

BACKGROUND OF THE INVENTION

In recent years, electronic devices are getting light, thin, short, and small, so flat panel displays are more and more important. The recent dual display technology manufactures two organic LED substrates independently and then bond the two substrates together so as to achieve the dual display. The drawback is that the whole device is heavy and thick. It does not satisfy the tendency toward light, thin, short, and small for devices. Besides, the structure needs two driving units to drive the organic LED substrates respectively so as to produce the dual display whereas the cost is increased.

A dual display device is disclosed in public having the characteristic that it uses an image conversion module to achieve the dual display function for the organic LEDs on the single substrate. The drawbacks are that the both sides cannot display different frames at the same time. Further, it needs one more conversion module to achieve the dual display.

Another dual display device utilizes a substrate to manufacture a top organic LED with an active driving circuit and a bottom organic LED with a passive driving circuit in a pixel area. However, because the structure has to form two driving circuits (the active and passive driving circuits) and two organic LEDs within a pixel area, the aperture ratio and resolution is decreased.

SUMMARY OF THE INVENTION

Consequently, for solving the abovementioned problems, the main purpose of the current invention is to drive the top organic LED and the bottom organic LED by using the same active driving circuit on the single substrate so as to achieve the dual display device.

The second purpose of the current invention is that the stacked structure formed by the top organic LED and the bottom organic LED. The emitter of the both type organic LED cannot interfere with each other within one pixel such that the device has a large aperture ratio and the resolution is increased.

The present invention is a dual display device, each pixel of the dual display device includes a transparent substrate, an active driving circuit, a top organic LED and a bottom organic LED. The bottom organic LED includes a first anode electrode, a first organic layer and a first cathode electrode in sequence. The first anode electrode connects to the active driving circuit electronically. Then, an insulation layer covers the active driving circuit and the bottom organic LED and further has a contact hole. A connection element covers the insulation layer, and connects to the electrode of the first anode electrically through the contact hole. The top organic LED includes a second anode electrode, a second organic layer and a second cathode electrode in sequence. The second anode electrode is located on the connection element and connects to the connection element electrically.

Hence, each pixel forms a stacked structure that is constructed by the top organic LED and the bottom organic LED on the transparent substrate. The anodes of the two organic LEDs connect electrically by the connection element. The electrode of the first anode then connects to the active driving circuit electrically. And each cathode of the two organic LEDs connects to the connection of the circuit individually. By utilizing this structure, the top and bottom organic LEDs can be driven respectively so as to achieve the dual display device.

BRIEF DESCRIPTION FOR THE DRAWINGS

FIGS. 3A~3M are schematic diagrams for the manufacture process of the present invention.

Figure 4:
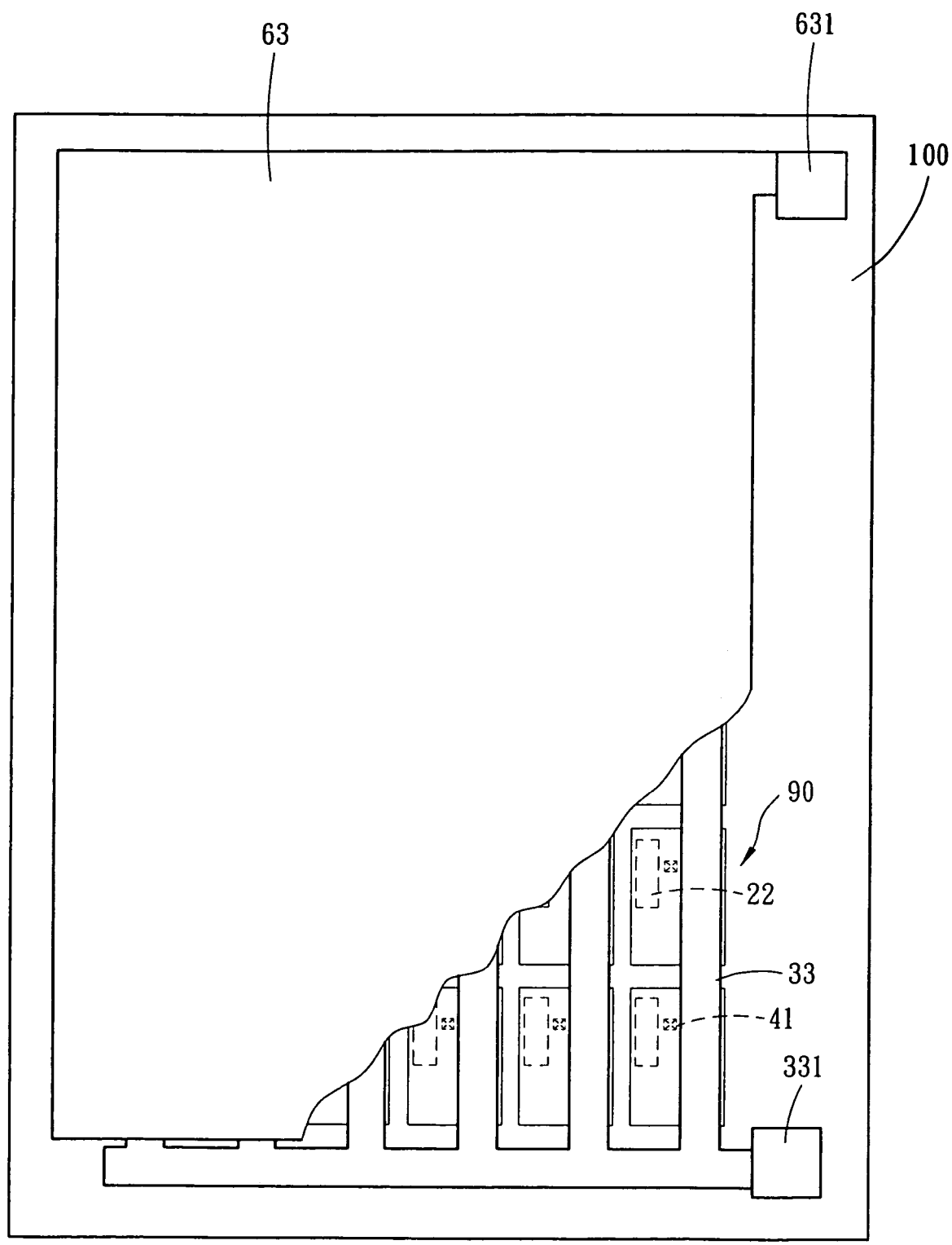

FIG. 4 is the plane schematic diagram for the dual display device of the present invention.

DETAILED DESCRIPTION OF THE PREFERRED EMBODIMENT

The detailed descriptions for content and technology of the present invention associated with figures are as follows.

Figure 1:
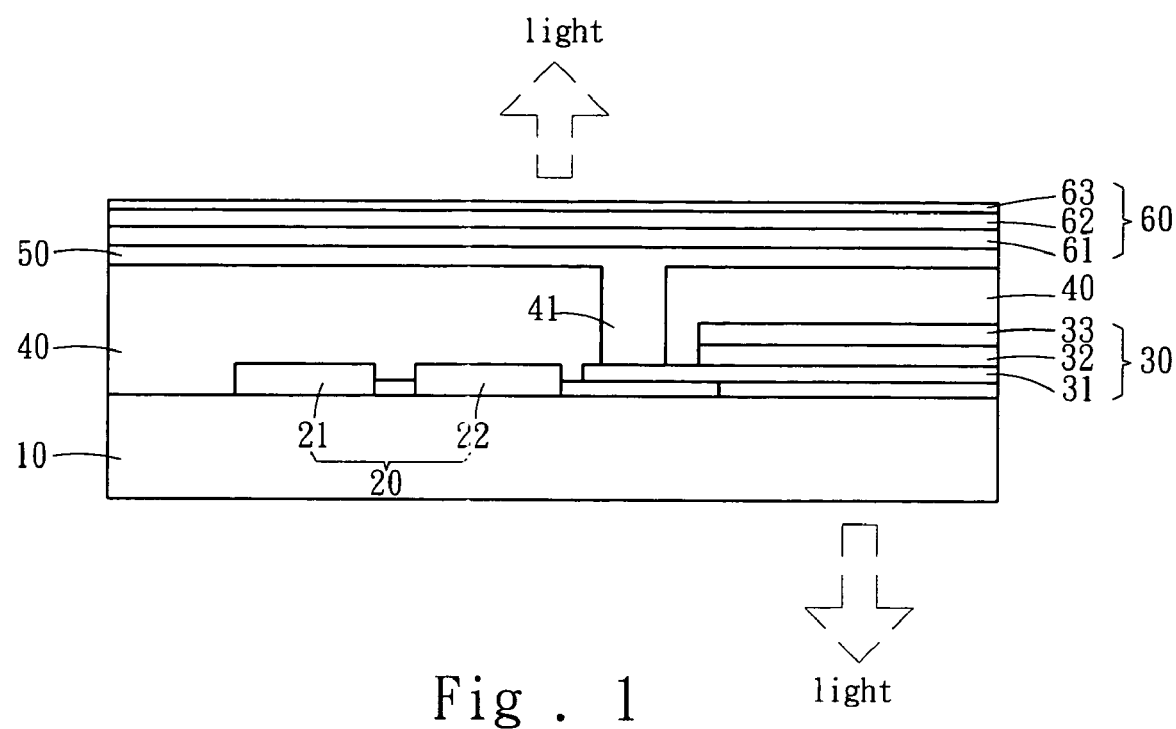
FIG. 1 is the schematic diagram for the dual display device of the present invention.
Figure 2:
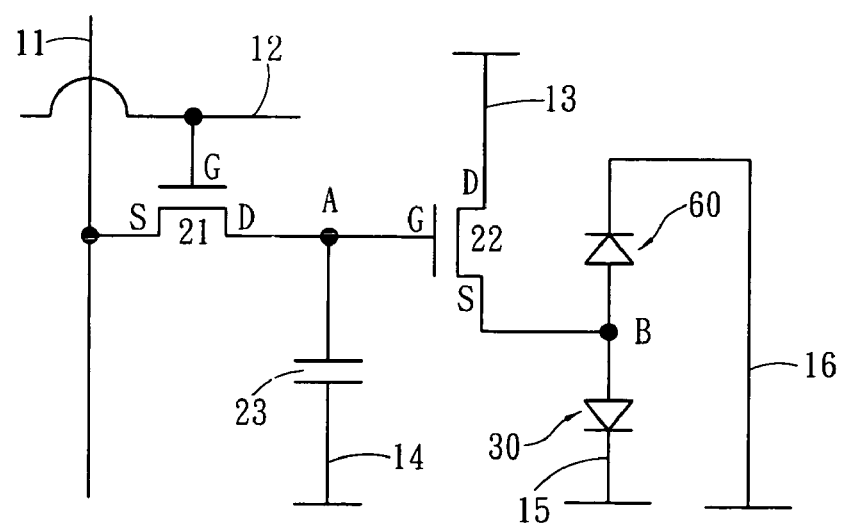
FIG. 2 is the schematic diagram for the circuit structure of the present invention.

Please refer to FIGS. 1 and 2 together. Each pixel of the dual display device of the present invention includes a transparent substrate 10. The transparent substrate 10 is a selected from the group consisting of a rigid substrate and a flexible substrate. The transparent substrate 10 is formed with an active driving circuit 20 and a bottom organic LED 30. The active driving circuit 20 includes at least one capacitor 23, at least one switch thin film transistor (TFT) 21, and at least one driving TFT 22. The bottom organic LED 30 includes a first anode electrode 31, a first organic layer 32, and a first cathode electrode 33. The first anode electrode 31 is deposited on the transparent substrate 10 and connects to the active driving circuit 20 electrically.

An insulation layer 40 covers the active driving circuit 20 and the bottom organic LED 30 and further has a contact hole 41. The insulation layer 40 is selected from isolation materials that are made of $SiN_x$, $SiO_x$, or Si polymer. A connection element 50 is formed on top of the insulation layer 40 and electrically connects to the first anode electrode 31 through the contact hole 41. The connection element 50 is selected from those materials with high conductivity such as aluminum, calcium, magnesium, indium, tin, manganese, silver, and gold.

A top organic LED 60 includes a second anode electrode 61, a second organic layer 62 and a second cathode electrode 63 in sequence. The second anode electrode 61 is deposited on the top of the connection element and connects to the connection element 50 electrically.

The first anode electrode 31 and the second anode electrode 61 are conductive metal oxides, and the material of the conductive metal oxide can be indium tin oxide (ITO), zinc aluminium oxide (AZO), or indium zinc oxide (IZO).

The material of the first cathode electrode 33 can be aluminum, calcium, magnesium, indium, tin, manganese, silver, gold, or magnesium alloy. The second cathode electrode 63 is a transparent conductive film, which is composed of thin metal, metal oxide, or the composite combined by both, and should preserve its transparency. The metal can be aluminum, calcium, magnesium, indium, tin, manganese, silver, gold, or magnesium alloy. The metal oxide can be ITO, AZO, or IZO.

The first organic layer 32 and the second organic layer 33 include at least one of a hole-injection layer, a hole-transport layer, an emitting layer, an electron-transport layer and an electron-injection layer or their combination.

Hence, each pixel forms a stacked structure that is constructed by the top organic LED 60 and the bottom organic LED 30 on the transparent substrate 10. By utilizing this structure can form the dual display by respectively driving the top and bottom organic LEDs so as to achieve the large aperture ratio.

Please refer to FIG. 2. Further description for the circuit and driving method of the present invention is going to be described. The source electrode of the driving thin film transistor's (TFT) 22 of the present invention connects to the connection element 50 (refer to FIG. 1), and the connection element 50 connects to the anode of the bottom organic LED 30 and the anode of the top organic LED 60. Besides, a storage capacitor 23 is connected to the gate electrode of driving TFT 22 and the drain electrode of switch TFT 21. Furthermore, the cathode of the bottom organic LED 30 connects to a second power supply line 15, and the cathode of the top organic LED 60 connects to a third power supply line 16. The driving TFT's 22 drain electrode connects to a first power supply line 13, the other terminal of storage capacitor 23 connects to the common power supply line 14, the switch TFT's 21 gate electrode connects to the selecting line 12 and its source electrode connects to the data line 11.

The present invention uses the frame inversion method to drive the two organic LEDs. When the nth frame is activating, the second power supply line 15 is at high level voltage (e.g. +10V), the third power supply line 16 is at low level voltage (e.g. 0V), the first power supply line 13 is at fixed level voltage (e.g. +10V), and the common power supply line 14 is at fixed level voltage (e.g. 0V). At this time, the voltage level of node A is the same with the voltage of the data line 11, so there is current passing through the top organic LED 60 such that the top organic LED 60 emits light. On the contrary, because it presents a reverse bias between the node B and the second power supply line 15, there is no current passing through the bottom organic LED 30 such that the bottom organic LED 30 does not emit light.

When the next frame (the (n+1)th frame) is activating, the second power supply line 15 is switched to be at low level voltage (e.g. 0V), the third power supply line 16 is switched to be at high level voltage (e.g. +10V), the first power supply line 13 is at fixed level voltage (e.g. +10V), and the common power supply line 14 is at fixed level voltage (e.g. 0V). At this time, the voltage level of node A is at the voltage of the data line 11, so there is current passing through the bottom organic LED 30 such that the bottom organic LED 30 emits light. On the contrary, because it presents a reverse bias between the node B and the third power supply line 16, there is no current passing through the top organic LED 60 such that the top organic LED 60 does not emit light.

By way of this frame inversion-driving mode, different displayed pictures can be seen from both sides. Through the frame-switching mode to execute the data transmission for the two organic LEDs so as to realize the active matrix-driving mode and the to display different pictures on dual sides by using a driving TFT 22 to drive the bottom organic LED 30 and the top organic LED 60.

Figure 3A:
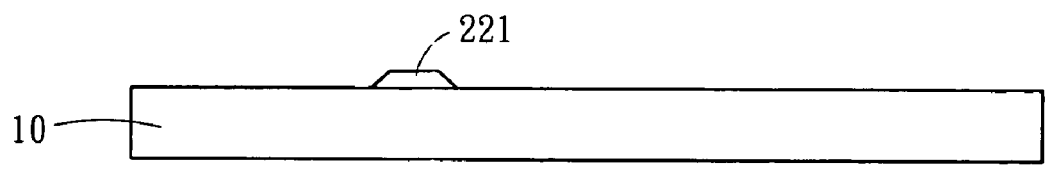
Figure 3B:
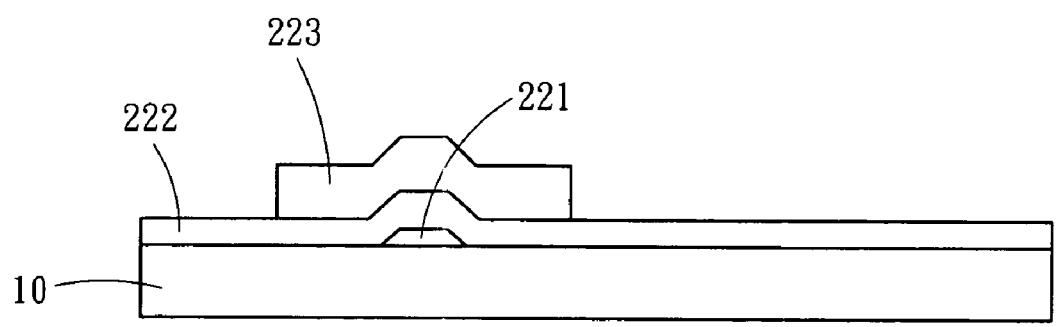
Figure 3C:
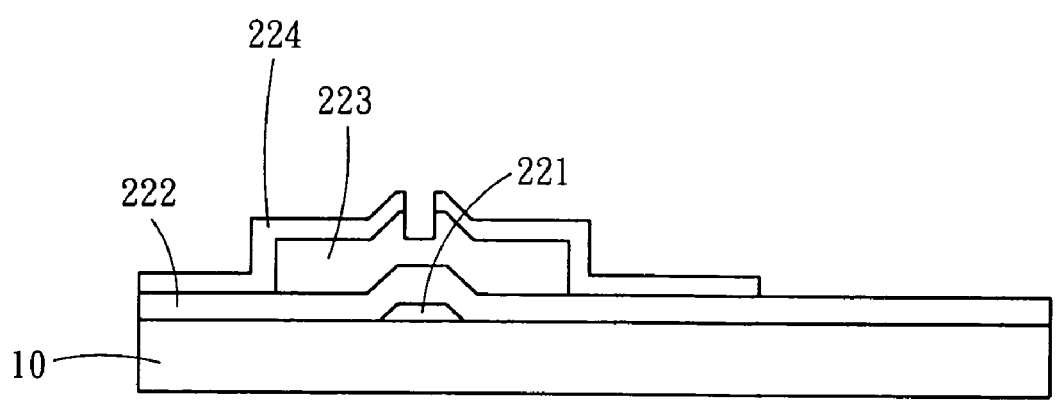
Figure 3D:
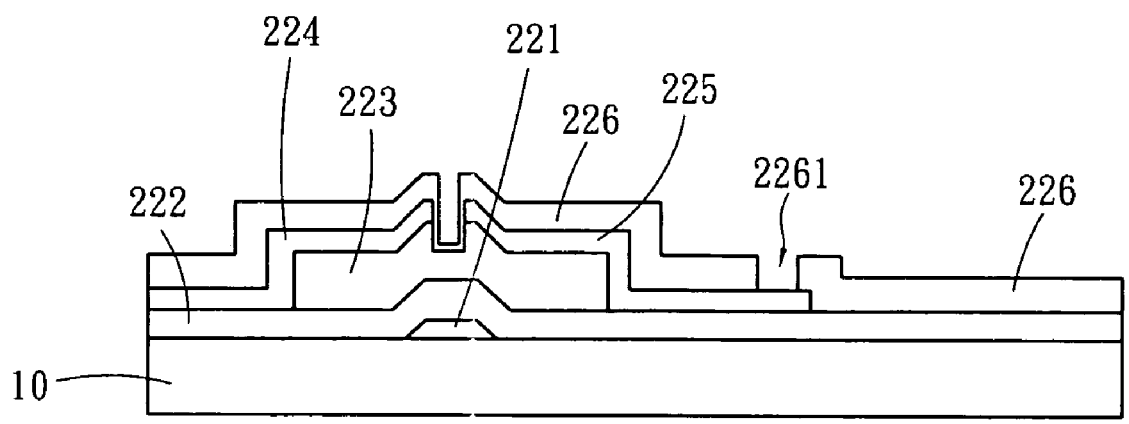
Figure 3E:
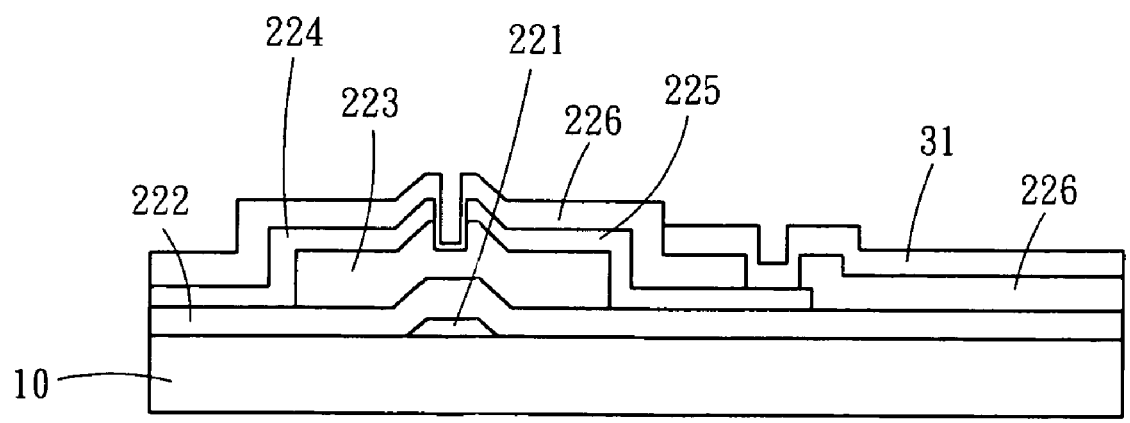

Please refer to FIGS. 3A~3N, the present invention describe the manufacture of the dual display device. First, pattern of the driving TFT's 22 gate electrode 221 (as shown in FIG. 3A), and then deposit a gate insulation layer 222 and an active layer 223 that is composed of polycrystalline silicon or amorphous silicon (as shown in FIG. 3B). Next, pattern the driving TFT's 22 drain electrode 224 of and the source electrode 225 (as shown in FIG. 3C), then deposit and pattern a passivation 226, and form a contact window 2261 (as shown in FIG. 3D). After that, the first anode electrode 31 is formed, and the driving TFT 22 electrically connects to the first anode electrode 31 through the contact window 2261 (as shown in FIG. 3E).

Figure 3F:
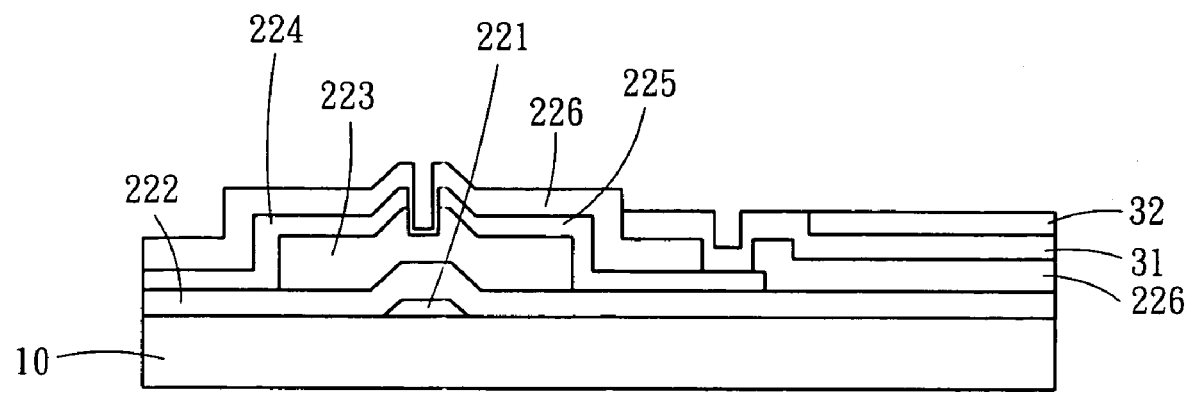
Figure 3G:
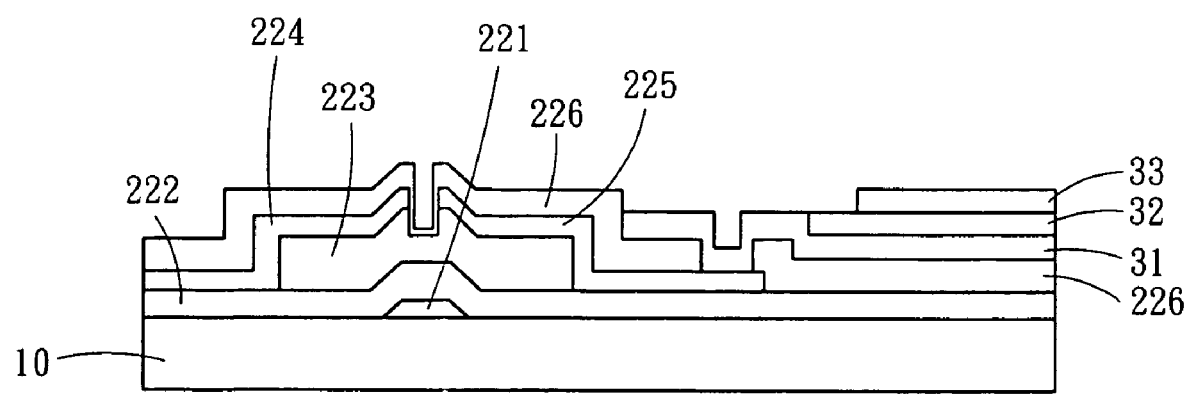
Figure 3H:
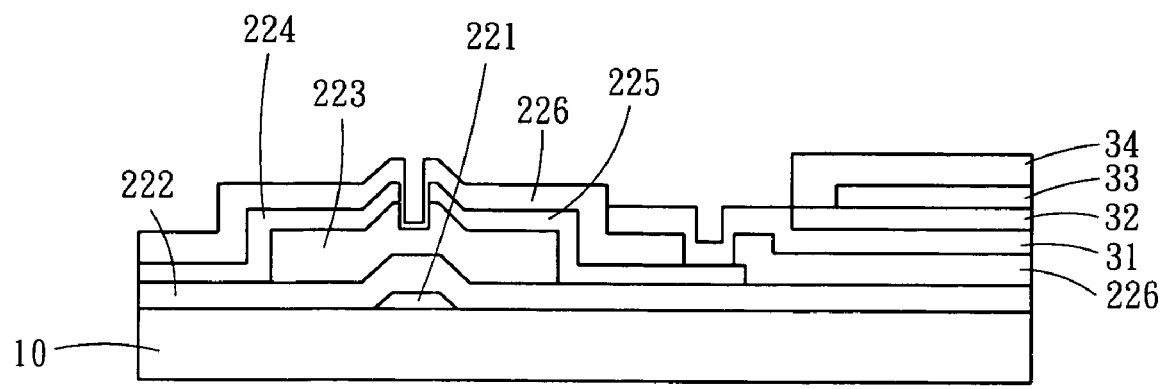

The following step is to manufacture the first organic layer 32 of the bottom organic LED 30 (as shown in FIG. 3F), such as the hole-transport layer, the emitting layer, the electron-transport layer, and the electron-injection layer. Then the first cathode electrode 33 of the bottom organic LED 30 is formed (as shown in FIG. 3G). A first insulation layer 34 (as shown in FIG. 3H) deposits on the top of the bottom organic LED 30. The first insulation layer 34 is to protect and isolate the bottom organic LED 30 during the subsequent procedure.

Figure 3I:
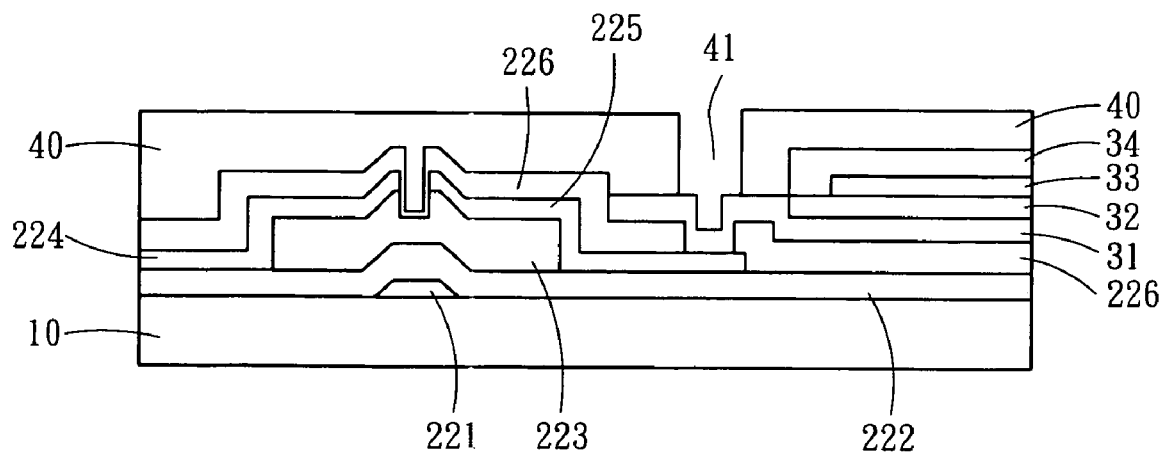
Figure 3J:
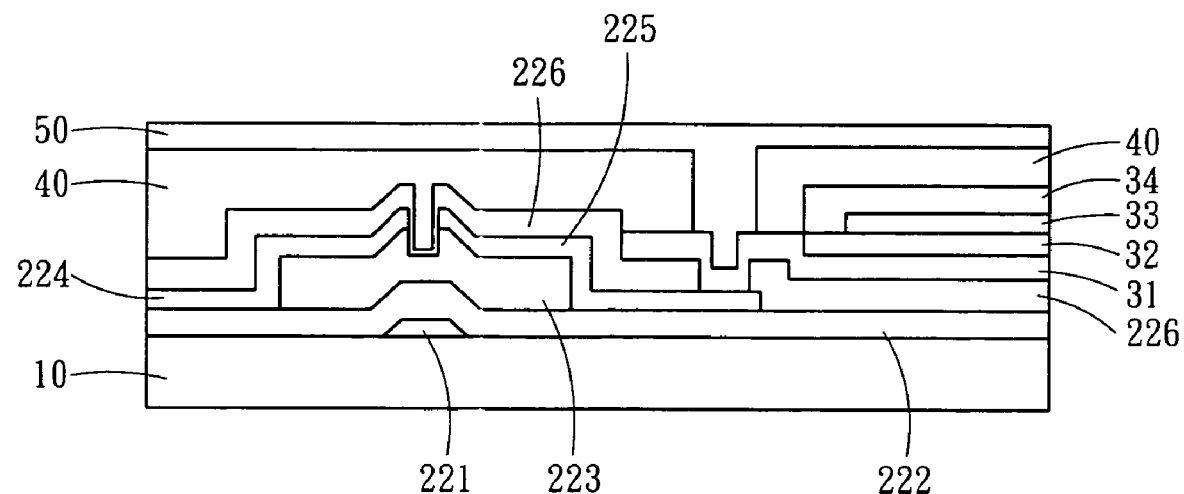

The follow-up procedure is to manufacture the top organic LED 60 that deposits on the top of the first insulation layer 34 and the driving TFT 22. First, deposit the second insulation layer 40 on the structure shown in FIG. 3H. Then, a contact hole 41 is formed (as shown in FIG. 3I) on the second insulation layer 40. Finally, the connection element 50 is formed with high conductivity on the surface of the second insulation layer 40, and electrically connects to the first anode electrode 31 through the contact hole 41 (as shown in FIG. 3J).

Figure 3K:
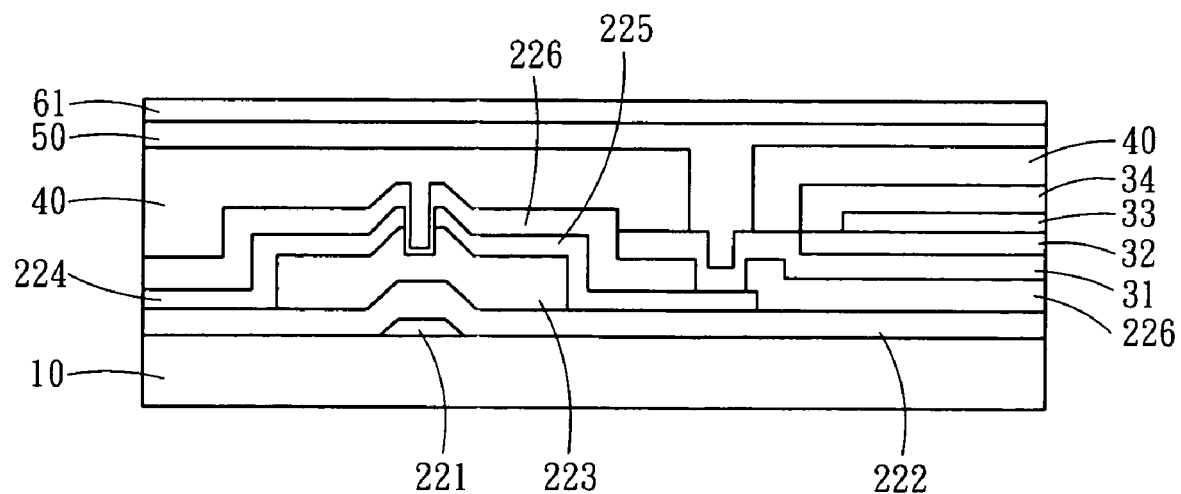
Figure 3L:
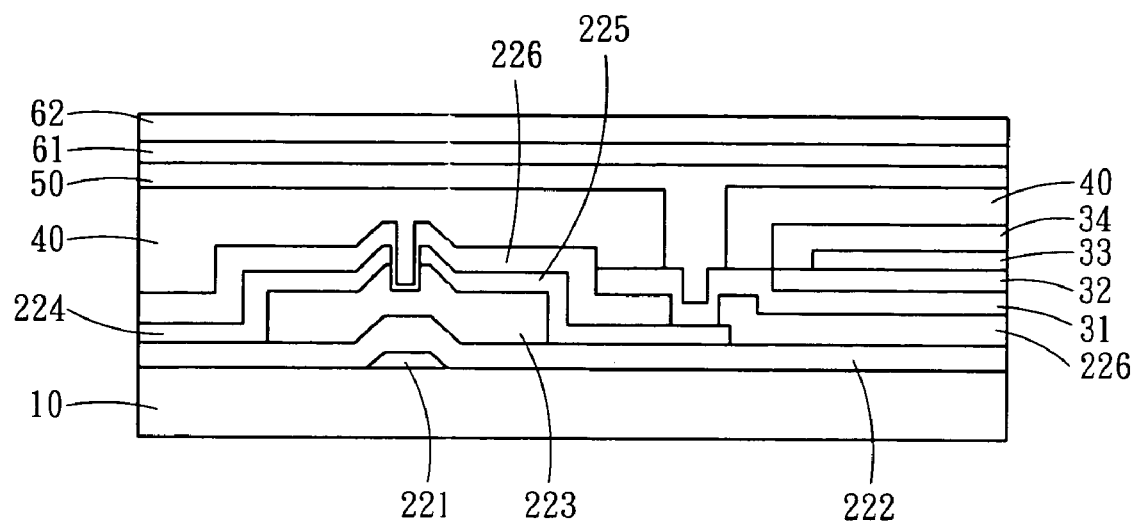
Figure 3M:
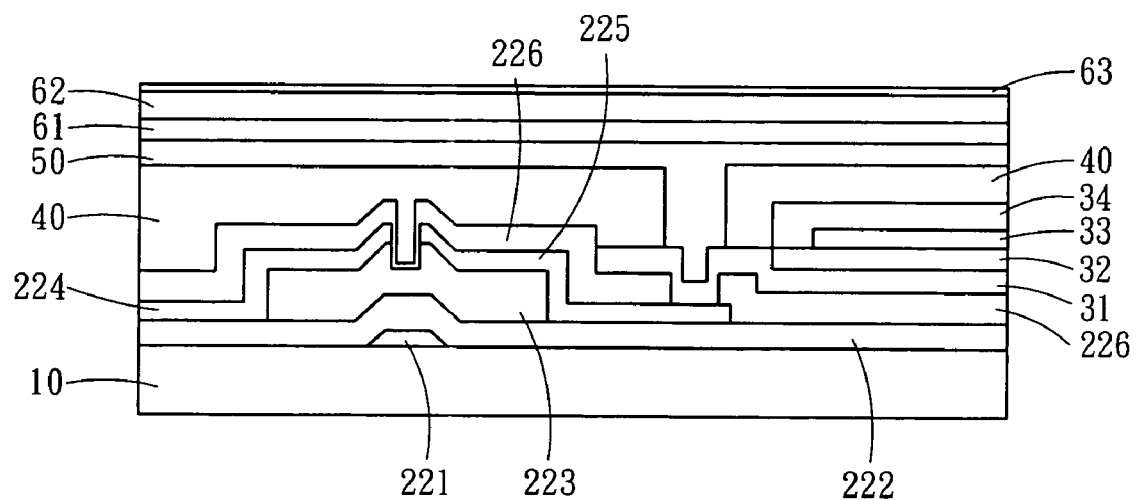

Depositing the second anode electrode 61 (as shown in FIG. 3K) constructed by a conductive material with high work function is to be the anode of the top organic LED 60. And then, the second organic layer 62 is formed that includes at least one of the hole-injection layer, the hole-transport layer, the emitting layer, the electron-transport layer and electron-injection layer or the combination from them (as shown in FIG. 3L) deposited on the second anode electrode 61. Next, construct the second cathode electrode 63 by a low work function material to be the cathode of the top organic LED 60. The second cathode electrode 63 is a transparent cathode. The second cathode electrode 63 is a transparent conductive film, which is composed of thin metal, metal oxide, or the composite combination by both, and should preserve its transparency (as shown in FIG. 3M).

Hence, each pixel forms a stacked structure that is constructed by the top organic LED 60 and the bottom organic LED 30 on the transparent substrate 10, and electrically connects to the driving TFT's 22 source electrode 225 of the active driving circuit 20 through the connection element 50.

Each cathode of the two organic LEDs connects to the circuit individually. Please refer to FIG. 4, which is top view of the dual display device of the present invention. Plural of pixel arrays 90 are forms on the transparent substrate 100. Each pixel 90 has the contact hole 41 and the driving TFT 22. The first cathode electrodes 33 connect to the first pad 331 that electrically connects to the second power supply line 15 (as shown in FIG. 2). The second cathode electrode 63 is a plane shape and forms the cathode of the top organic LED 60. The second cathode electrodes 63 connect to the second pad 631 that electrically connects to the third power supply line 16 (as shown in FIG. 2). As a result, two cathodes of the organic LED are separated by the insulation layer 40 and drive by different voltages from the first pad 331 and the second pad 631 respectively so as to achieve the dual display.

However, the above description is only a better practice example for the current invention, which is not used to limit the practice scope of the invention. All equivalent changes and modifications based on the claimed items of the present invention are in the scope of the present invention.

What is claimed is:

1. A dual display device, which has pixels and each pixel includes:
   a transparent substrate;
   an active driving circuit formed on the transparent substrate;

a bottom organic LED formed on the transparent substrate, and the bottom organic LED includes a first anode electrode, a first organic layer and a first cathode electrode in sequence, wherein the first anode electrode connects to the active driving circuit electrically;

an insulation layer, which covers the active driving circuit and the bottom organic LED and further has a contact hole;

a connection element, which covers the insulation layer and electrically connects to the first anode electrode through the contact hole;

a top organic LED, formed on the connection element, the top organic LED includes a second anode electrode, a second organic layer, and a second cathode electrode in sequence, and the second anode electrode connects to the connection element electrically.

2. The dual display device of claim 1, wherein the active driving circuit includes at least one capacitor, at least one switch thin film transistor (TFT), and at least one driving thin film transistor (TFT).

3. The dual display device of claim 1, wherein the transparent substrate is one selected from the group consisting of a rigid substrate and a flexible substrate.

4. The dual display device of claim 1, wherein the first anode electrode and the second anode electrode are conductive metal oxides.

5. The dual display device of claim 4, wherein the conductive metal oxide is a material selected from the group consisting of indium tin oxide (ITO), zinc aluminum oxide (AZO), and indium zinc oxide (IZO).

6. The dual display device of claim 1, wherein the first cathode electrode is a material selected from the group consisting of aluminum, calcium, magnesium, indium, tin, manganese, silver, gold, and magnesium alloy.

7. The dual display device of claim 1, wherein the first organic layer and the second organic layer include at least a hole-injection layer, a hole-transport layer, an emitting layer, an electron-transport layer and an electron-injection layer.

8. The dual display device of claim 1, wherein the material of the insulation layer is one selected from the group consisting of $SiN_x$, SiOx, and Si polymer.

9. The dual display device of claim 1, wherein the material of the connection element is one selected from the group consisting of aluminum, calcium, magnesium, indium, tin, manganese, silver, and gold.

10. The dual display device of claim 1, wherein the material of the second cathode electrode is one selected from the group consisting of aluminum, calcium, magnesium, indium, tin, manganese, silver, gold, and magnesium alloy.

11. The dual display device of claim 1, wherein the material of the second cathode electrode is one selected from the group consisting of indium tin oxide (ITO), zinc aluminum oxide (AZO), and indium zinc oxide (IZO).

12. The dual display device of claim 1, wherein the material of the second cathode electrode is a composite that is composed of metal and metal oxide.

13. The dual display device of claim 12, wherein the material of the metal is one selected from the group consisting of aluminum, calcium, magnesium, indium, tin, manganese, silver, gold, and magnesium alloy.

14. The dual display device of claim 12, wherein the material of the metal oxide is a material selected from the group consisting of indium tin oxide (ITO), zinc aluminum oxide (AZO), and indium zinc oxide (IZO).

* * * * *